(12) United States Patent
Balgheim et al.

(10) Patent No.: US 10,002,723 B2
(45) Date of Patent: Jun. 19, 2018

(54) SWITCH

(71) Applicant: Johnson Electric S.A., Murten (CH)

(72) Inventors: Udo Balgheim, Hueckeswagen (DE); Dirk Weiss, Altena (DE)

(73) Assignee: JOHNSON ELECTRIC S.A., Murten (CH)

( * ) Notice: Subject to any disclaimer, the term of this patent is extended or adjusted under 35 U.S.C. 154(b) by 182 days.

(21) Appl. No.: 14/736,043

(22) Filed: Jun. 10, 2015

(65) Prior Publication Data
US 2015/0357130 A1 Dec. 10, 2015

(30) Foreign Application Priority Data

Jun. 10, 2014 (DE) .................. 10 2014 108 158

(51) Int. Cl.
H01H 13/14 (2006.01)
H01H 23/12 (2006.01)
H01H 9/16 (2006.01)
G06F 1/26 (2006.01)
G01R 31/28 (2006.01)

(52) U.S. Cl.
CPC ............ *H01H 13/14* (2013.01); *H01H 9/161* (2013.01); *H01H 23/12* (2013.01); *G01R 31/2825* (2013.01); *G06F 1/266* (2013.01); *H01H 2009/164* (2013.01); *H01H 2221/016* (2013.01); *Y10T 307/944* (2015.04)

(58) Field of Classification Search
CPC ................................. G06F 1/266; H01H 13/14
See application file for complete search history.

(56) References Cited

U.S. PATENT DOCUMENTS

| 4,316,276 | A | * | 2/1982 | Koehler | ................. | G04G 5/045 |
| | | | | | | 368/188 |
| 4,500,795 | A | * | 2/1985 | Hochstein | ............... | G04F 1/005 |
| | | | | | | 307/141 |
| 4,672,233 | A | * | 6/1987 | Scott | .................... | G05B 19/104 |
| | | | | | | 307/116 |
| 6,114,839 | A | * | 9/2000 | Takano | ............. | H01M 10/4257 |
| | | | | | | 320/150 |

(Continued)

FOREIGN PATENT DOCUMENTS

| DE | 2536190 A1 | 2/1976 | |
| DE | 20 2007 004 0499 U1 | 8/2008 | |
| DE | 102007014174 A1 | * 9/2008 | ............. H01H 73/40 |

*Primary Examiner* — Thienvu Tran
*Assistant Examiner* — Pinping Sun
(74) *Attorney, Agent, or Firm* — Muncy, Geissler, Olds & Lowe, P.C.

(57) ABSTRACT

A switch for controlling an electrical appliance has a switch housing, an actuation element, a display, and a microprocessor disposed in the switch housing. The actuation element can activate an identifier through the display, which identifier is determined by the microprocessor. Selection of an appropriate system state and an associated maximum value is effected by again actuating the actuation element, specifically while the corresponding identifier associated with this system state is active or displayed. Reaching or exceeding the maximum value is indicated by a signal that is produced by the microprocessor. The microprocessor can optionally be activated once again for a reset mode and/or for a change mode.

20 Claims, 2 Drawing Sheets

(56) References Cited

U.S. PATENT DOCUMENTS

| | | | | |
|---|---|---|---|---|
| 6,648,840 B2* | 11/2003 | Cutler | ................ | A61H 23/0263 601/15 |
| 6,765,477 B2* | 7/2004 | Right | .................... | G08B 25/12 200/43.01 |
| 2004/0217655 A1* | 11/2004 | Bruwer | .................... | H01H 9/54 307/126 |
| 2005/0223301 A1* | 10/2005 | Stabrowski | ............... | G06F 1/24 714/51 |
| 2008/0109682 A1* | 5/2008 | Kim | ........................ | G06F 11/00 714/40 |
| 2013/0289909 A1* | 10/2013 | Lin | ......................... | G06F 17/00 702/64 |
| 2015/0112577 A1* | 4/2015 | Velusamy | ........... | F02D 41/2422 701/110 |
| 2015/0159887 A1* | 6/2015 | Kadah | .................. | F24D 19/1084 700/276 |
| 2015/0179377 A1* | 6/2015 | Han | ..................... | H01H 47/002 307/125 |

* cited by examiner

SWITCH

CROSS REFERENCE TO RELATED APPLICATIONS

This non-provisional patent application claims priority under 35 U.S.C. § 119(a) from Patent Application No. 10 2014 108 158.7 filed in Germany on Jun. 10, 2014, the entire contents of which are hereby incorporated by reference.

FIELD OF THE INVENTION

This invention relates to a switch to control electrical appliances, in particular, domestic appliances.

BACKGROUND OF THE INVENTION

An electrical switch for controlling an electric appliance disclosed in document DE 10 2007 014 174 A1 is in widespread use and has proven successful in practice. This switch has an external interface. A microprocessor disposed in the switch housing can be controlled through this external interface, and switching states or displays in the switch or the electrical appliance can be changed.

In addition, a battery-operated electronic clock is disclosed in U.S. Pat. No. 4,316,276. A single push-button switch is provided on the clock housing, which switch can be operated by the user while adhering to a specific code whereby a signal sequence can be initiated. A desired time display is then selected by repeat actuation of the switch. In addition, a reset function is described. At least two counters for the counting operation are provided in the switch. For use of this switch in an electronic appliance an additional switch is required as an ON and OFF switch of the appliance.

SUMMARY OF THE INVENTION

Hence there is a desire for an improved electrical switch so as to enable it to be used for a plurality of applications without the need for additional cost in terms of technical components.

Accordingly, in one aspect thereof the present invention provides a switch for controlling an electrical appliance, comprising: a switch housing; a display; an actuation element projecting from the switch housing, which element can activate at least one contact of the appliance when it is moved from an OFF position to an ON position, wherein changing the switching state changes an operating state of the electrical appliance and/or the display a microprocessor disposed in the switch housing, by means of which processor the operating state of the appliance and/or the display can be changed by comparing a determined actual value with a stored maximum value for a system state; and a selector for selecting an appropriate maximum value from among possible maximum values for a desired system state, wherein one initial value and one maximum value each are stored in the microprocessor for each system state available for selection, when the electrical appliance is first turned on by the actuation element precisely this actuation element through its motion activates through the display an identifier for different signals determined by the microprocessor, wherein the different signals correspond to different system states; selection of an appropriate system state for the electrical appliance can be effected by actuating the actuation element, specifically while the corresponding signal associated with this system state is active, wherein the associated maximum value for operating the electrical appliance can also be determined by actuating the actuation element; reaching or exceeding the maximum value for the selected system state can be indicated by a warning signal produced by the microprocessor; and optionally repeat activation of the microprocessor is possible for a reset mode and/or for a change mode.

Preferably, an initial value for the operating duration or for the operating temperature, for example, a time 0 or temperature value, and also a maximum value, for example, a shut-off time or a maximum temperature, are stored in the microprocessor.

Preferably, the actuation element is a rocker switch or a push-button switch, and an identifier of different signals can be initiated through the display, said identifier being determined by the microprocessor, when the electrical appliance is first turned on by moving the switch from the OFF position to the ON position.

Preferably, in order to select the appropriate system state for the electrical appliance an activation of the microprocessor can be effected by moving the actuation element from the ON position to the OFF position, and specifically while the corresponding signal is active that is associated with this system state.

Preferably, the identifier of different signals is reproduced by an optical or acoustic signal, preferably by an optical signal of the display.

Preferably, different signals can be indicated by varying the length of the signal duration or by varying the frequency of reproduction, or by varying the color of optical signals.

Preferably, reaching or exceeding the maximum value for the selected system state can also be indicated by an acoustic or optical warning signal.

Preferably, moving the actuation element from its ON position to its OFF position can be effected while the warning signal for the reset mode or for the change mode is active, wherein the reset mode and/or the change mode can be indicated as different by acoustic or optical means, preferably different signals can be reproduced in different time windows.

According to a second aspect, the present invention provides a method for controlling electrical appliances, comprising creating a sequential program for a microprocessor disposed in a switch housing, comprising the steps of: defining different system states and defining initial values and maximum values for each system state; defining different signals; assigning one distinct signal to each system state; defining a warning signal for exceeding the maximum value; defining a reset mode and/or change mode; storing the sequential program and a control function in the microprocessor; starting the electrical appliance and optionally actuating the actuation element to activate the signals; and selecting one time a desired system state by actuating the actuation element while the relevant signal for the desired system state is active, whereby the maximum value is determined for operating the electrical appliance.

Preferably, actuating the actuation element is effected within a specified time interval to perform the one-time selection of the desired system state.

Preferably, the control function of the microprocessor is set to the initial value when the electrical appliance is first started, and each actuation of the actuation element is measured or counted by the microprocessor as the electrical appliance operates, and the attained actual value is compared with the maximum value.

Preferably, activation of an optical or acoustic warning signal is effected by the microprocessor when the maximum value has been reached or exceeded.

Preferably, different warning signals are indicated for the reset mode and for the change mode, and that either the reset mode or the change mode is effected by actuating the actuation element, and wherein the control function of the microprocessor is simultaneously set to the initial value.

Preferably, a determination is made by a sensor after a warning signal has been activated whether conditions exist or do not exist for continued operation of the electrical appliance, whereupon a reset mode or change mode is automatically or manually initiated, or the appliance is shut off.

Preferably, the microprocessor interacts with external sensors or thermal switches or current-measuring devices to determine the maximum value.

According to a third aspect, the present invention provides use of the switch according to the first aspect, to determine a maximum operating temperature of an electrical appliance, to determine a maximum operating duration for an electrical appliance, or to determine a shut-off time for the stand-by mode of an electrical appliance.

As with the switch disclosed in document DE 10 2007 014 174 A1, the switch according to the present invention is intended for use in electrical appliances. The switch has a switch housing that includes an associated actuation element which projects from the switch housing. Moving the actuation element, such as, for example, by a swivel, pressing, or sliding motion allows the actuation element to be moved from an OFF position to an ON position. In the ON position the actuation element, as with known switches, can activate at least one contact of the electrical appliance, thereby changing the operational state of the electrical appliance and/or a display. Display means are provided for this display, preferably directly on the actuation element. For example, this can be an LED light. A microprocessor is disposed in the switch housing. This microprocessor can be activated and it can compare current actual values transmitted to it with values that are stored in the microprocessor, specifically maximum values for a system state. The operating state of the appliance and/or a display can be changed by means of this comparison and corresponding evaluation.

This system state can relate, for example, to a shut-off time, operating duration, operating temperature, a maximum value for physical parameters such as temperature, time, amperage, voltage, volume level, etc.

In the case of an appliance, the operating state of the appliance can also be changed whenever a maximum value is reached or has been exceeded. If, for example, the system state relates to an operating temperature and the maximum value is a maximum temperature, the microprocessor can effect a change in the operating state of the appliance in response to this maximum temperature having been exceeded by reducing, for example, the rpm for a rotational speed of an appliance or even shutting off the appliance.

This system state can also relate to the stand-by mode of an electrical appliance. Different shut-off times can be associated with various stand-by times, the shut-off times being stored in the microprocessor as maximum values.

In this invention all selectable system states are stored in the switch. Selection of an appropriate maximum value from among multiple possible maximum values for a desired system state is not effected externally but, as it were, internally. An initial value, a maximum value, and a corresponding program are stored in the microprocessor for all selectable system states, such as, for example, operating temperature or operating duration. The program initiates a specific identifier that can include various acoustic and/or optical signals—preferably optical signals of varying illumination time and/or illumination frequency and/or different colors which display various system states to the user. Selection of the desired system state is made when the electrical appliance is first turned on. Thus, for example, a specific system state can be set such as the shut-off time. To this end, the microprocessor initiates a specific signal sequence of different signals through the display. This can be effected simply by establishing an electrical connection between the appliance and a power source. i.e., the identifier is emitted whenever the appliance plug is simply plugged in. What is preferred, however, is an embodiment in which this identifier is initiated only after the initial actuation of the actuation element, i.e., the actuation element is tuned on, the microprocessor initiates the identifier to select the system state where different optical or acoustic signals correspond to the identifier for different system states. Selection of the system state is then effected by again actuating the actuation element. This means the actuation element is actuated, e.g. turned off during the identifier for a specific signal. As a result, precisely that system state is set which corresponds to this signal. Through this actuation the maximum value is determined for operating the electrical appliance for this system state, which value is used by the microprocessor by way of comparison as the maximum value when the appliance is operating.

Once this system state is set, the electrical appliance can be operated by repeat actuation of the actuation element. A comparison of the actual value with the maximum value is performed by the microprocessor in response to each repeat actuation of the actuation element. The microprocessor can, for example, also have a counter function. A warning signal is produced by the microprocessor whenever a maximum value is reached. This can be an acoustic warning signal or an optical warning signal such as an LED flashing orange. An optical signal is preferred since the switch is already equipped with optical display means.

If the system state relates, for example, to an operating duration, the warning signal of the microprocessor indicates that the previously set operating duration has been reached or exceeded. As a result the appliance can be shut off.

If the system state of an electrical appliance relates, for example, to the operating temperature, the microprocessor indicates that the allowable temperature has been exceeded by a warning signal. The warning signal can then indicate that the electrical appliance will shut off automatically or will be moved to a different operating state within a specified time interval.

Once the warning signal has been exceeded and the operator has been instructed about an action to be taken or the operating state of the electrical appliance has been changed by the microprocessor, the warning signal continues until the microprocessor is once again activated. A new initial value and/or system state can be reset by means of a reset mode and/or change mode. The activation can be effected by the actuation element of the switch. The reset mode causes the counter function in the microprocessor to be reset to the initial value of zero. If however the actuation element is switched off within a different time interval, this resets to the initial state of the appliance. A new system state can be set just as when the first start-up was effected.

The reset mode in another embodiment can also be effected automatically by sensors—for example, thermal elements monitoring the operating temperature can transmit signals to the microprocessor, with the result that the microprocessor again displays a new initial value and thus again enables operation once the appliance has cooled down.

The inventive embodiment of the switch for an electrical appliance supports saving energy in household appliances or other electrical appliances, and supports implementation of European Eco-Design Directive ErP. Switches according to the invention can be customized for use within a wide spectrum of applications. A desired system state (shut-off time, operating temperature, stand-by mode, etc.) can be selected by a switch for an electrical appliance, after which this switch can be used to operate the appliance and optionally for a reset mode and a change mode.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENT

Figure 1:
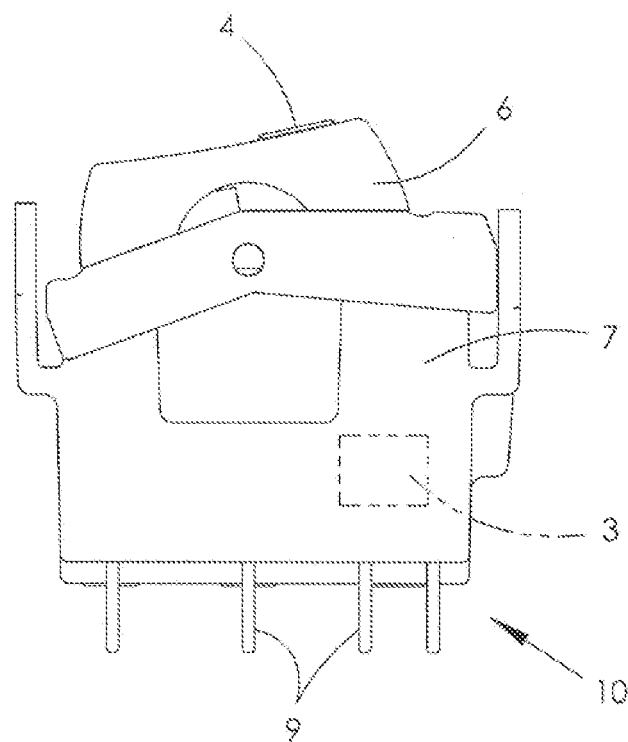
FIG. 1 is a side view of a switch according to the preferred embodiment of the present invention.

The following discussion describes the invention in more detail based on an exemplary embodiment. A switch is used for the electrical appliance, the switch being depicted in FIG. 1 and FIG. 2. The actuation element 6 projects from the housing 7 of the switch 10, this actuation element being provided in the form of a rocker switch. A display 4 is provided on this actuation element 6 in the form of a light-emitting diode. Contacts 9, which are connected in the known manner to the electrical appliance, project from the bottom of switch 10. A microprocessor 3 is provided inside housing 7 of switch 10. Microprocessor 3 includes switching electronics. Microprocessor 3 that is disposed in switch housing 7 is appropriately programmed to control the electrical appliance, and the various selectable system states are stored there. A minimum and/or maximum value is furthermore defined for each system state. The diagram of FIG. 3 depicts a possible selection window for selecting the system state for switch 10 of the electrical appliance.

When switch 10 is turned on for the first time, the user can select between different system states (e.g., shut-off time, temperature, power, etc.). If switch 10 is then turned off within a specific time interval, microprocessor 3 is set to execute the program of the selected system state, e.g. shut-off time. If the maximum value defined for this system state has been reached as the electrical appliance continues to be used, the switch emits an optical or acoustic signal, in this case an optical signal, i.e., LED 4 illuminates.

The user can now choose whether to stay at this level. In this case he selects the reset mode by performing another switching operation of actuation element 6, for example, within a specified time interval.

If a different system state is to be selected such as e.g., the temperature, the user can implement the change mode. In this case the entire system is reset by a further switching operation of actuation element 6 within a specified time interval. The time interval here between the change mode and the reset mode are different. After the entire system is reset, another selection of the system state can be effected as already described above.

All of the above-mentioned actions are programmed accordingly in microprocessor 3. In addition, above-described switch 10 according to the invention can also be used to set other system states that have not been mentioned. Both the rocker switch shown in FIG. 1 as well as a push-button switch or other electrical switch can be used for this purpose.

In addition, the maximum value can be determined by internal or external sensors for a specific electrical appliance, and optionally a determination can also be made whether this appliance is again ready to operate after reaching or exceeding the maximum value and is reset automatically. The invention is thus not restricted to the exemplary embodiment.

A bistable switch of an electrical appliance can advantageously handle a plurality of functions. The actuation element of this switch is used both for turning on and off the electrical appliance as well as selecting a system state. The display on the switch can display both functions. In addition, the reset function or a change to the system state can also be implemented and indicated by this single actuation element.

Figure 2:
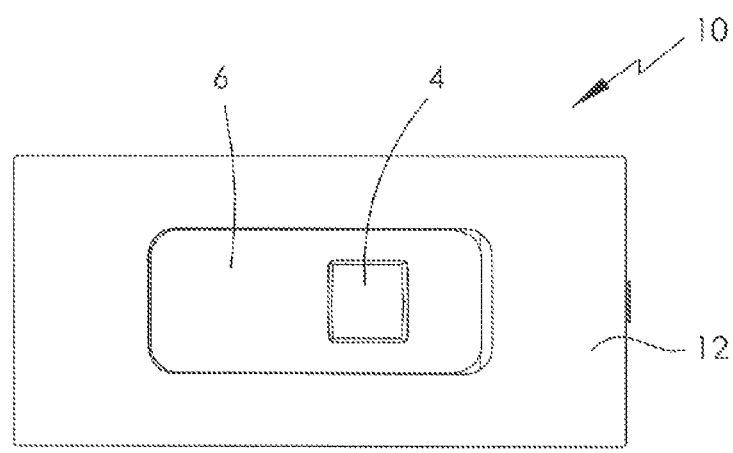
FIG. 2 is a plan view of the switch of FIG. 1, fitted to a panel.
Figure 3:
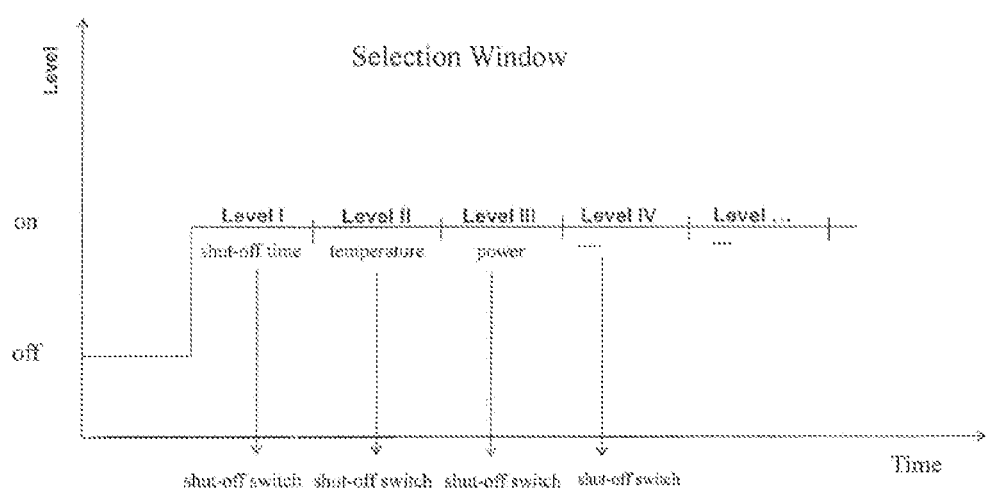
FIG. 3 is a diagram illustrating selection of possible switching states.

In FIG. 2, switch 10 is shown mounted to a panel 12. Panel 12 may be a control panel of the electrical appliance.

In the description and claims of the present application, each of the verbs "comprise", "include", "contain" and "have", and variations thereof, are used in an inclusive sense, to specify the presence of the stated item or feature but do not preclude the presence of additional items or features.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of example only, and various other modifications will be apparent to persons skilled in the field without departing from the scope of the invention as defined by the appended claims.

The invention claimed is:

1. Switch for controlling an electrical appliance, comprising:
   a switch housing;
   a display;
   an actuation element projecting from the switch housing, which can activate at least one contact of the appliance when it is moved from an OFF position to an ON position, wherein changing a switching state of the contact changes an operating state of the electrical appliance and/or the display;
   a microprocessor disposed in the switch housing and various selectable system states are stored in, the microprocessor changes the operating state of the appliance and/or display by comparing a determined actual value with a stored maximum value for one system state; and
   a selector for selecting an appropriate maximum value from possible maximum values for a desired system state, wherein one initial value and one maximum value each are stored in the microprocessor for each system state available for selection;

when the electrical appliance is initially activated by the actuation element, the microprocessor initiates an identifier for different signals deteitnined by the microprocessor which is displayed through the display, wherein the different signals correspond to different system states;

selection of an appropriate system state for the electrical appliance can be effected by actuating the actuation element, specifically while the corresponding signal associated with this system state is active, wherein the associated maximum value for operating the electrical appliance can also be determined by actuating the actuation element; and reaching or exceeding the maximum value for the selected system state can be indicated by a warning signal produced by the microprocessor.

2. The switch of claim 1, wherein an initial value for the operating duration or for the operating temperature, and also a maximum value for the operating duration or for the operating temperature, are stored in the microprocessor.

3. The switch of claim 1, wherein the actuation element is a rocker switch or a push-button switch, and the identifier of different signals can be initiated through the display, the identifier being determined by the microprocessor, when the electrical appliance is first turned on by moving the switch from the OFF position to the ON position.

4. The switch of claim 1, wherein in order to select the appropriate system state for the electrical appliance, an activation of the microprocessor can be effected by moving the actuation element from the ON position to the OFF position, and specifically while the corresponding signal is active that is associated with this system state.

5. The switch of claim 1, wherein the identifier of different signals is reproduced by an optical or acoustic signal.

6. The switch of claim 5, wherein different signals can be indicated by varying the length of the signal duration or by varying the frequency of reproduction, or by varying the color of optical signals.

7. The switch of claim 1, wherein reaching or exceeding the maximum value for the selected system state can also be indicated by an acoustic or optical warning signal.

8. The switch of claim 1, wherein moving the actuation element from its ON position to its OFF position can be effected while the warning signal for the reset mode or for the change mode is active, wherein the reset mode and/or the change mode can be indicated as different by acoustic or optical means.

9. Use of the switch of claim 1 to determine a maximum operating temperature of an electrical appliance, to determine a maximum operating duration for an electrical appliance, or to determine a shut-off time for a stand-by mode of an electrical appliance.

10. Method for controlling electrical appliances, comprising creating a sequential program for a microprocessor disposed in a switch housing, comprising the steps of:
defining different system states and defining initial values and maximum values for each system state;
defining different signals;
assigning one distinct signal to each system state; defining a warning signal for exceeding the maximum value; defining a reset mode and/or change mode;
storing the sequential program and a control function in the microprocessor; starting the electrical appliance and;
selecting one time a desired system state by actuating the actuation element while the relevant signal for the desired system state is active, whereby the maximum value is determined for operating the electrical appliance;
storing various selectable system states in the microprocessor;
changing the operating state of the appliance and/or display by comparing a determined actual value with a stored maximum value for one system state; and
executing one of the various selectable operating states based on a time interval when the switch is turned off.

11. The method of claim 10, wherein actuating the actuation element is effected within a specified time interval to perform the one-time selection of the desired system state.

12. The method of claim 10, wherein the control function of the microprocessor is set to the initial value when the electrical appliance is first started, and each actuation of the actuation element is measured or counted by the microprocessor as the electrical appliance operates, and the attained actual value is compared with the maximum value.

13. The method of claim 10, wherein activation of an optical or acoustic warning signal is effected by the microprocessor when the maximum value has been reached or exceeded.

14. The method of claim 10, wherein different warning signals are indicated for the reset mode and for the change mode, and that either the reset mode or the change mode is effected by actuating the actuation element, and wherein the control function of the microprocessor is simultaneously set to the initial value.

15. The method of claim 10, wherein a determination is made by a sensor after a warning signal has been activated whether conditions exist or do not exist for continued operation of the electrical appliance, whereupon a reset mode or change mode is automatically or manually initiated, or the appliance is shut off.

16. The method of claim 10, wherein the microprocessor interacts with external sensors or thermal switches or current-measuring devices to determine the maximum value.

17. Switch for controlling an electrical appliance, comprising:
a switch housing;
a display;
contacts, connected to the electrical appliance and/or the display;
an actuation element projecting from the switch housing, which can activate the at least one contact when it is moved from a first position to a second position, wherein an operating state of the electrical appliance and/or the display is changed by changing the state of the contacts; and
a microprocessor disposed in the switch housing and various selectable system states are stored in, the microprocessor changes the operating state of the appliance and/or display by comparing a determined actual value with a stored maximum value for one system state, wherein the microprocessor is programmed to control the electrical appliance, and a various selectable operating states are stored therein,
wherein when the switch is initially turned on, the microprocessor is set to execute one of the various selectable operating states based on a time interval when the switch is turned off.

18. The switch of claim 17, wherein one initial value and one maximum value each are stored in the microprocessor, when the operating state is set, an appropriate maximum value of possible maximum values for the operating state is selected and the microprocessor compares an actual operating value with the stored maximum value, wherein a warning signal is produced by the microprocessor when the maximum value has been reached or exceeded.

19. The switch of claim 18, wherein either the reset mode or the change mode is effected by actuating the actuation element when the warning signals are indicated.

20. The switch of claim 18, wherein the operating values, the initial values, and the maximum values for the operating duration or for the operating temperature are stored in the microprocessor.

\* \* \* \* \*